(12) United States Patent
Liu

(10) Patent No.: US 8,581,344 B2
(45) Date of Patent: Nov. 12, 2013

(54) LATERALLY DIFFUSED METAL OXIDE SEMICONDUCTOR TRANSISTORS

(75) Inventor: Ya-Sheng Liu, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 957 days.

(21) Appl. No.: 11/783,210

(22) Filed: Apr. 6, 2007

(65) Prior Publication Data

US 2008/0135934 A1  Jun. 12, 2008

(51) Int. Cl.
*H01L 29/66* (2006.01)

(52) U.S. Cl.
USPC ........... 257/343; 257/337; 257/341; 257/360; 257/355; 257/356; 257/401; 257/E23.153; 257/E29.013; 257/E29.116; 257/E29.118; 257/E29.121; 257/E29.146; 257/E29.255; 257/E29.258

(58) Field of Classification Search
USPC ......... 257/367, 403, 337, 341, 343, 360, 355, 257/356, 401, E23.153, E29.013, E29.027, 257/E29.116, E29.118, E29.121, E29.146, 257/E29.255, E29.258
See application file for complete search history.

(56) References Cited

U.S. PATENT DOCUMENTS

| | | | | | |
|---|---|---|---|---|---|
| 3,271,640 | A | * | 9/1966 | Moore | 257/378 |
| 3,639,813 | A | * | 2/1972 | Kamoshida et al. | 257/260 |
| 5,569,949 | A | * | 10/1996 | Malhi | 257/397 |
| 5,635,742 | A | * | 6/1997 | Hoshi et al. | 257/337 |
| 6,306,710 | B1 | * | 10/2001 | Long et al. | 438/279 |
| 2004/0178454 | A1 | * | 9/2004 | Kuroda et al. | 257/360 |
| 2004/0224492 | A1 | * | 11/2004 | Yang et al. | 438/618 |

FOREIGN PATENT DOCUMENTS

TW  392255  6/2000

* cited by examiner

*Primary Examiner* — Meiya Li
(74) *Attorney, Agent, or Firm* — Birch, Stewart, Kolasch & Birch, LLP

(57) ABSTRACT

A laterally diffused metal oxide semiconductor transistor. The laterally diffused metal oxide semiconductor transistor includes a substrate, a drain formed thereon, a source formed on the substrate, comprising a plurality of individual sub-sources respectively corresponding to various sides of the drain, a plurality of channels formed in the substrate between the sub-sources and the drain, a gate overlying a portion of the sub-sources and the channels, and a drift layer formed in the substrate underneath the drain.

17 Claims, 5 Drawing Sheets

LATERALLY DIFFUSED METAL OXIDE SEMICONDUCTOR TRANSISTORS

BACKGROUND OF THE INVENTION

1. Field of the Invention

The invention relates to a metal oxide semiconductor transistor, and in particular to a laterally diffused metal oxide semiconductor transistor.

2. Description of the Related Art

With rapid growth in the use of wireless communication products such as mobile phones and base stations, laterally diffused metal oxide semiconductor (LDMOS) transistors based on complementary metal oxide semiconductor (CMOS) structures used in radio frequency (900 MHz~2.4 GHz) circuits have been developed. Such devices with high operating bandwidth, high breakdown voltage, and high output power are suitable for use in power amplifier of wireless communication base station.

FIG. 1 is a cross section of a conventional laterally diffused metal oxide semiconductor transistor. In the device, a source 1 and a drain 2 are extended to form an N+ region 3. The N+ region 3 underneath the drain 2 is diffused to form an N-drift region 4. The N+ region 3 is an N-type heavy-doped region. The N-drift region 4 is an N-type lightly doped region. Various concentrations and lengths of the N-drift region 4 affect the breakdown voltage and resistance of the device. When concentration decreases and length increases, the breakdown voltage and resistance thereof increase. A P-body 5 represents a channel. The doped concentration of the P-body 5 is altered to control the threshold voltage. Additionally, a P-sink 6, a P-type heavy-doped region, is connected with the source 1 and a substrate 7 to reduce the parasitic capacitance therebetween, improving heat dissipation. A P-well 8, a lighter P-type doped region, serves as an epitaxy layer of the substrate 7. An oxide layer underneath the gate 9 represents a gate oxide layer 11. The threshold voltage is affected by the thickness thereof.

The N-drift region with low concentration and large area surrounding the N+ region underneath the drain effectively reduces the breakdown between the drain and source, facilitating operation of high-voltage devices.

Unlike the metal oxide semiconductor transistor, the laterally diffused metal oxide semiconductor transistor replaces the heavy-doped region with a lightly doped N-drift region to buffer the most voltage drops applied from the drain to obtain the high breakdown voltage.

The laterally diffused metal oxide semiconductor transistor layout also affects the breakdown voltage. Referring to FIG. 2, a drain 2 is formed on the center of the layout pattern. A source 1 and a gate 9 formed thereon then surround the drain 2 to form a closed structure. The corners of the layout pattern, however, may cause excessive current concentration and deteriorate heat dissipation, resulting in second breakdown.

Another laterally diffused metal oxide semiconductor transistor layout including addition of parallel numbers and length of transistors 13 also decreases the breakdown voltage, as shown in FIG. 3.

Thus, a LDMOS transistor layout with reduced current density and increased breakdown voltage and heat dissipation is desirable.

BRIEF SUMMARY OF THE INVENTION

The invention provides a laterally diffused metal oxide semiconductor transistor comprising a substrate, a drain formed thereon, a source formed on the substrate, comprising a plurality of individual sub-sources respectively corresponding to various sides of the drain, a plurality of channels formed in the substrate between the sub-sources and the drain, a gate overlying a portion of the sub-sources and the channels, and a drift layer The invention also provides a laterally diffused metal oxide semiconductor transistor comprising a substrate, a drain formed thereon, comprising a plurality of individual sub-drains, a source formed on the substrate, comprising a plurality of individual sub-sources respectively corresponding to the sub-drains, a gate overlying a portion of the sub-sources, and a drift layer formed in the substrate underneath the sub-drains.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
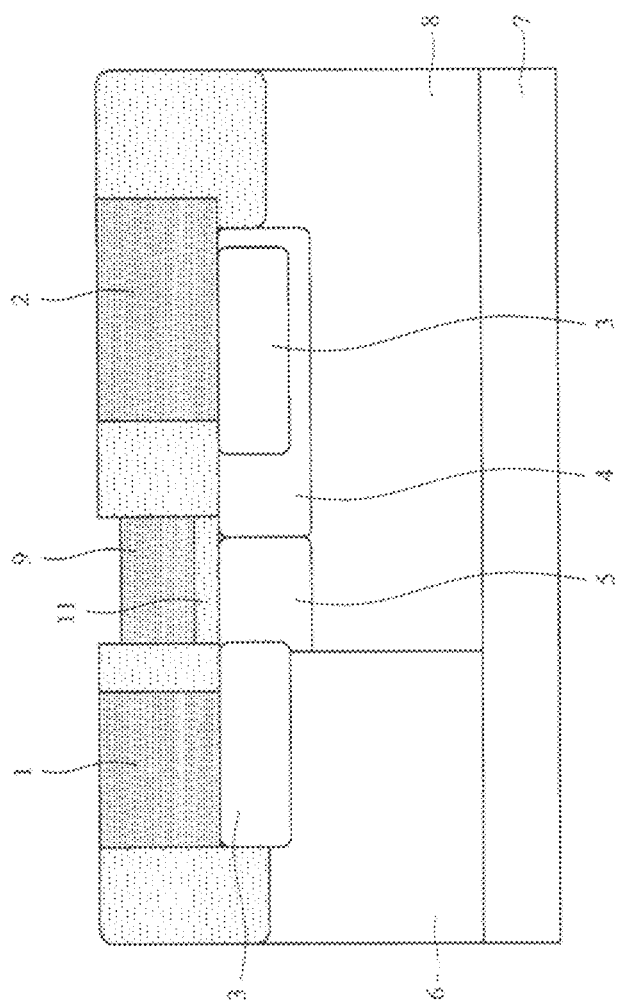
FIG. 1 is a cross section of a conventional laterally diffused metal oxide semiconductor transistor.
Figure 2:
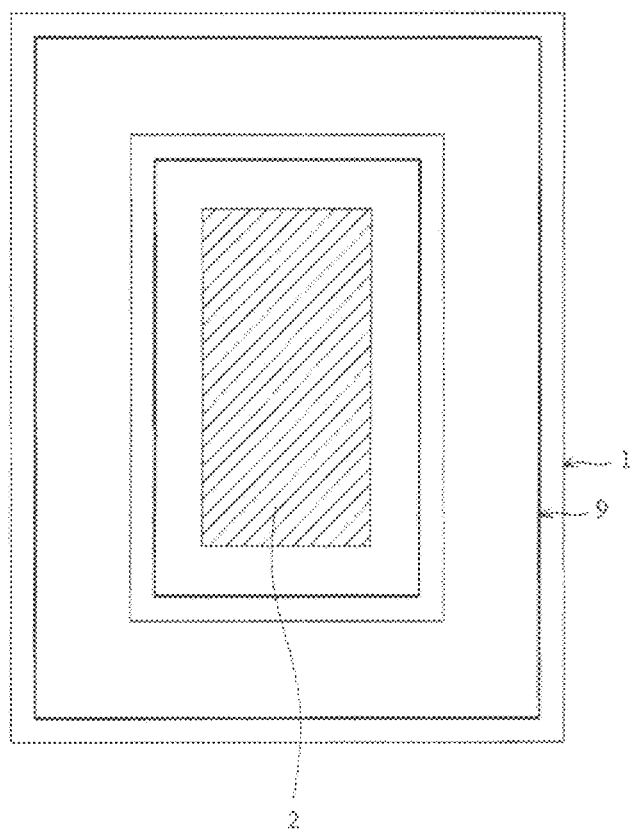
FIG. 2 is a top view of a conventional laterally diffused metal oxide semiconductor transistor.
Figure 3:
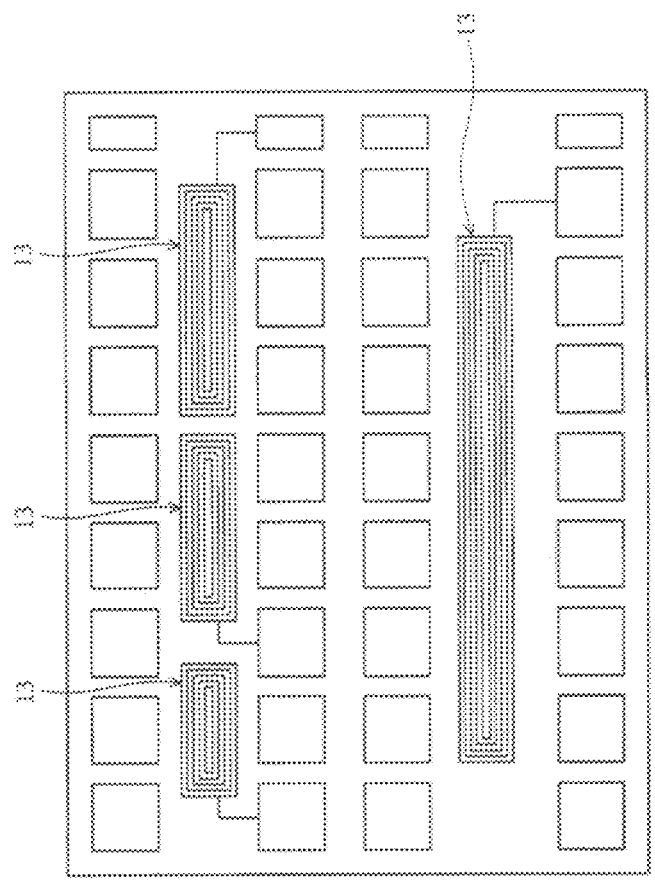
FIG. 3 is a top view of a conventional laterally diffused metal oxide semiconductor transistor.
Figure 4:
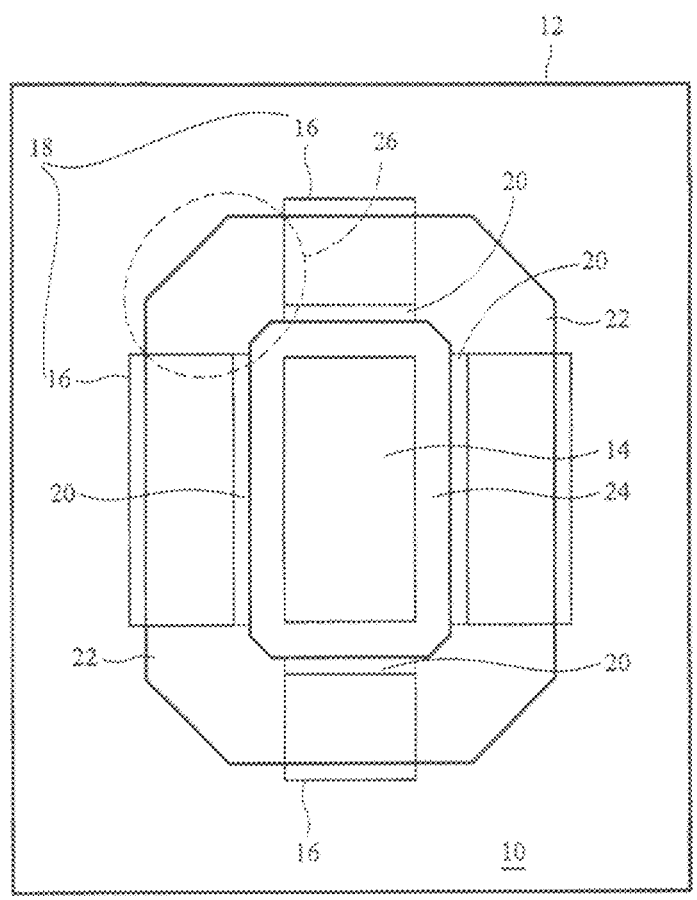
FIG. 4 is a top view of a laterally diffused metal oxide semiconductor transistor of the invention.

FIG. 4 is a top view of a laterally diffused metal oxide semiconductor transistor of the invention. Referring to FIG. 4, the laterally diffused metal oxide semiconductor transistor 10 comprises a substrate 12, a drain 14, a source 18 comprising a plurality of sub-sources 16, a plurality of channels 20, a gate 22, and a drift layer 24.

The drain 14 and the source 18 are formed on the substrate 12. The sub-sources 16 are individual and correspond to various sides of the drain 14. The channels 20 are formed in the substrate 12 between the sub-sources 16 and the drain 14. The gate 22 overlies a portion of the sub-sources 16 and the channels 20. The drift layer 24 is formed in the substrate 12 underneath the drain 14.

The drain 14 may be a polygon such as a rectangle. The sub-sources 16 are parallel to the drain 14. The gate 22 surrounds the drain 14 to form a closed structure. Specifically, the closed gate 22 is chamfered at a corner 26. When no channel is formed at the corner 26, the corner gate 22 may serve as a field plate to reduce surface electric field, improving junction quality. The drift layer 24 surrounds the drain 14 to increase the breakdown voltage. The drift layer 24 is a lightly doped region such as an N-type drift layer.

In the invention, the channels formed at the corner are removed to reduce the current density thereof, decreasing heat formation. Thus, the second breakdown voltage of the high-voltage device such as the laterally diffused metal oxide semiconductor transistor is increased when a gate is opened. Additionally, the sub-sources and the drain parallel to one another avoid formation of bent channels, effectively reducing the current density.

Figure 5:
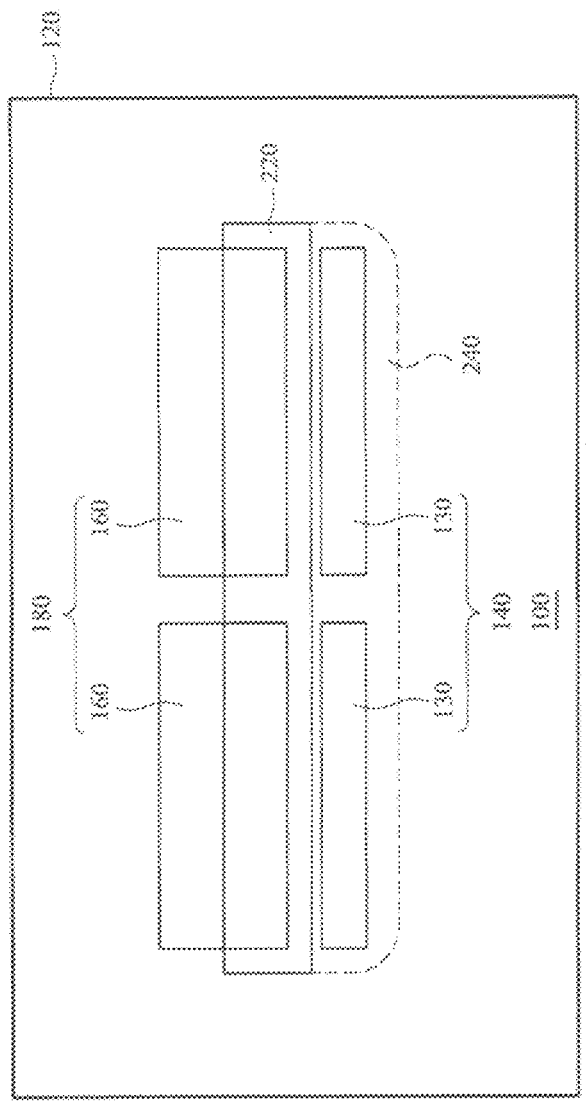
FIG. 5 is a top view of a laterally diffused metal oxide semiconductor transistor of the invention.

FIG. 5 is a top view of a laterally diffused metal oxide semiconductor transistor of the invention. Referring to FIG. 5, the laterally diffused metal oxide semiconductor transistor 100 comprises a substrate 120, a drain 140 comprising a plurality of sub-drains 130, a source 180 comprising a plurality of sub-sources 160, a plurality of channels 200, a gate 220, and a drift layer 240.

The drain 140 and the source 180 are formed on the substrate 120. The sub-sources 160 are individual and correspond to the individual sub-drains 130. The gate 220 overlies a portion of the sub-sources 160. The drift layer 240 is formed in the substrate 120 underneath the sub-drains 130.

Similarly, the sub-drains 130 may be polygons such as rectangles. The sub-sources 160 are parallel to the sub-drains 130. The interval of each sub-drains 130 is about 0.5~5 μm. The interval of each sub-source 160 is about 0.5~5 μm. The drift layer 240 surrounds the drain 140 to increase the breakdown voltage. The drift layer 240 is a lightly doped region such as an N-type drift layer.

Compared to the conventional method of increasing output current by extending the source/drain or increasing the parallel numbers of transistors, the invention uses a plurality of segmental source/drains to extend the transistor, effectively reducing the heat formation per unit area.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A laterally diffused metal oxide semiconductor transistor, comprising:
    a substrate;
    a drain formed on the substrate;
    a source formed on the substrate, comprising a plurality of individual sub-sources respectively corresponding to various sides of the drain;
    a plurality of channels formed in the substrate between the sub-sources and the drain;
    a gate overlying a portion of the sub-sources and the channels, wherein the gate is chamfered and no channel is formed under the gate between the sub-sources; and
    a drift layer formed in the substrate underneath the drain, wherein the drain is surrounded by the drift layer but no drift layer is formed underneath the source.

2. The laterally diffused metal oxide semiconductor transistor as claimed in claim 1, wherein the drain is polyhedral.

3. The laterally diffused metal oxide semiconductor transistor as claimed in claim 2, wherein the drain is rectangular.

4. The laterally diffused metal oxide semiconductor transistor as claimed in claim 1, wherein the sub-sources are parallel to the drain.

5. The laterally diffused metal oxide semiconductor transistor as claimed in claim 1, wherein the drain is surrounded by the gate.

6. The laterally diffused metal oxide semiconductor transistor as claimed in claim 1, wherein the gate at the corner serves as a field plate.

7. The laterally diffused metal oxide semiconductor transistor as claimed in claim 1, wherein the drift layer is an N-type drift layer.

8. The laterally diffused metal oxide semiconductor transistor as claimed in claim 1, wherein the drift layer is a doped region.

9. A laterally diffused metal oxide semiconductor transistor, comprising:
    a substrate;
    a drain formed on the substrate, comprising a plurality of individual sub-drains;
    a source formed on the substrate, comprising a plurality of individual sub-sources, wherein each of the sub-sources corresponds to a different one of the sub-drains;
    a gate overlying a portion of the sub-sources; and
    a drift layer formed in the substrate underneath the sub-drains, wherein the drain is surrounded by the drift layer but not drift layer is formed underneath the drain.

10. The laterally diffused metal oxide semiconductor transistor as claimed in claim 9, wherein the sub-drains are polyhedral.

11. The laterally diffused metal oxide semiconductor transistor as claimed in claim 10, wherein the sub-drains are rectangular.

12. The laterally diffused metal oxide semiconductor transistor as claimed in claim 9, wherein the sub-sources are parallel to the sub-drains.

13. The laterally diffused metal oxide semiconductor transistor as claimed in claim 9, wherein the interval between each sub-drain is about 0.5~5 μm.

14. The laterally diffused metal oxide semiconductor transistor as claimed in claim 9, wherein the interval between each sub-source is about 0.5~5 μm.

15. The laterally diffused metal oxide semiconductor transistor as claimed in claim 9, wherein the sub-drains are surrounded by the drift layer.

16. The laterally diffused metal oxide semiconductor transistor as claimed in claim 9, wherein the drift layer is an N-type drift layer.

17. The laterally diffused metal oxide semiconductor transistor as claimed in claim 9, wherein the drift layer is a doped region.

* * * * *